US011856721B2

(12) United States Patent
Cheng et al.

(10) Patent No.: US 11,856,721 B2
(45) Date of Patent: Dec. 26, 2023

(54) FLEXIBLE DISPLAY DEVICE AND ELECTRONIC DEVICE

(71) Applicant: GUANGDONG OPPO MOBILE TELECOMMUNICATIONS CORP., LTD., Guangdong (CN)

(72) Inventors: Jiao Cheng, Guangdong (CN); Zekuan Zheng, Guangdong (CN)

(73) Assignee: GUANGDONG OPPO MOBILE TELECOMMUNICATIONS CORP., LTD., Dongguan (CN)

(*) Notice: Subject to any disclaimer, the term of this patent is extended or adjusted under 35 U.S.C. 154(b) by 301 days.

(21) Appl. No.: 17/507,529

(22) Filed: Oct. 21, 2021

(65) Prior Publication Data

US 2022/0046813 A1 Feb. 10, 2022

Related U.S. Application Data

(63) Continuation of application No. PCT/CN2020/082092, filed on Mar. 30, 2020.

(30) Foreign Application Priority Data

Apr. 25, 2019 (CN) .......................... 201910343363.8

(51) Int. Cl.
*H05K 5/02* (2006.01)
*H05K 5/00* (2006.01)
(52) U.S. Cl.
CPC ......... *H05K 5/0217* (2013.01); *H05K 5/0017* (2013.01)
(58) Field of Classification Search
CPC .. H05K 5/0217; H05K 5/0017; G06F 1/1652; H04M 1/022; H04M 1/0268; G09F 9/301
See application file for complete search history.

(56) References Cited

U.S. PATENT DOCUMENTS 10,895,894 B2 * 1/2021 Jan ........................ G06F 1/1652
11,231,752 B2 * 1/2022 Liu ....................... H04M 1/0216
(Continued)

FOREIGN PATENT DOCUMENTS

| CN | 106205385 A | 12/2016 |
|----|-------------|---------|
| CN | 206136000 U | 4/2017 |

(Continued)

OTHER PUBLICATIONS

Chinese First Office Action with English Translation for CN Application 201910343363.8 dated Feb. 22, 2021. (17 pages).

(Continued)

*Primary Examiner* — Abhishek M Rathod
(74) *Attorney, Agent, or Firm* — Young Basile Hanlon & MacFarlane, P.C.

(57) ABSTRACT

An electronic device is provided, which includes a first frame body, a second frame body, and a flexible display device. The flexible display device includes a flexible screen and a rotating mechanism. The flexible screen includes a bendable area and a screen body layer. The rotating mechanism is connected between the first frame body and the second frame body. The flexible screen of the flexible display device covers the first frame body and the second frame body. The rotating mechanism supports the back face of the bendable area. The rotating mechanism is configured to rotate around two rotating center axes spaced apart in parallel. The bendable area is configured to bend with rotation of the rotating mechanism. The screen body layer is a neutral layer of the flexible screen during bending of the flexible screen. A flexible display device is also provided.

17 Claims, 10 Drawing Sheets

(56) References Cited

U.S. PATENT DOCUMENTS

2017/0374749 A1   12/2017  Lee et al.
2018/0324964 A1*  11/2018  Yoo ..................... H01Q 1/2266
2021/0373609 A1*  12/2021  Kim ..................... G06F 1/1681

FOREIGN PATENT DOCUMENTS

| | | |
|---|---|---|
| CN | 107464502 A | 12/2017 |
| CN | 207777905 U | 8/2018 |
| CN | 108648624 A | 10/2018 |
| CN | 208353382 U | 1/2019 |
| CN | 109302513 A | 2/2019 |
| CN | 109469680 A | 3/2019 |
| CN | 110332217 A | 10/2019 |
| CN | 209731301 U | 12/2019 |
| EP | 3637742 A1 | 4/2020 |
| EP | 3889452 A1 | 10/2021 |
| EP | 3910919 A1 | 11/2021 |
| KR | 20140066064 A | 5/2014 |
| WO | 2013076710 A2 | 5/2013 |
| WO | 2018223875 A1 | 12/2018 |

OTHER PUBLICATIONS

International Search Report with English Translation for International Application PCT/CN2020/082092 dated Jun. 12, 2020. (13 pages).
Extended European Search Report for EP Application 20794454.7 dated Apr. 14, 2022. (13 pages).

* cited by examiner

FLEXIBLE DISPLAY DEVICE AND ELECTRONIC DEVICE

CROSS-REFERENCE TO RELATED APPLICATION(S)

This application is a continuation of International Application No. PCT/CN2020/082092, filed on Mar. 30, 2020, which claims priority to Chinese Patent Application No. 2019103433638, filed on Apr. 25, 2019, the entire disclosures of both of which are incorporated herein by reference.

TECHNICAL FIELD

This disclosure relates to the technical field of display devices of electronic equipment, and in particular to a flexible display device and an electronic device equipped with a flexible display device.

BACKGROUND

Flexible displays are widely preferred by consumers because of their advantages such as being foldable, curved, flexible, stretchable, or the like. Generally, the flexible display is folded via a single rotating center axis. However, when the flexible display with the single rotating center axis is bent, a bending area of the flexible display is under a large pulling force, which can easily cause damage to the flexible display and affect functions of the flexible display.

SUMMARY

Disclosed herein are implementations of a flexible display device and an electronic device equipped with the flexible display device.

In order to solve above-mentioned technical problems, a flexible display device is provided in this disclosure. The flexible display device includes a flexible screen and a rotating mechanism. The flexible screen has a bendable area and includes a screen body layer. The rotating mechanism supports the back of the bendable area, and the rotating mechanism is configured to rotate around two rotating center axes spaced apart in parallel. The bendable area is configured to bend with rotation of the rotating mechanism. The screen body layer in the bendable area is a neutral layer of the flexible screen.

An electronic device is also provided in this disclosure. The electronic device includes a first frame body, a second frame, and a flexible display device. The flexible display device includes a flexible screen and a rotating mechanism. The flexible screen has a bendable area and includes a screen body layer. The rotating mechanism connected between the first frame body and the second frame body. The flexible screen covers the first frame body and the second frame body. The rotating mechanism supports the back of the bendable area and is configured to rotate around two rotating center axes spaced apart in parallel. The bendable area is configured to bend with rotation of the rotating mechanism. The screen body layer in the bendable area is a neutral layer of the flexible screen.

BRIEF DESCRIPTION OF DRAWINGS

In order to describe technical solutions of implementations more clearly, the following will give a brief introduction to accompanying drawings used for describing implementations. Apparently, the accompanying drawings hereinafter described are only a part of implementations of the disclosure. Based on these drawings, those of ordinary skill in the art can also obtain other obvious deformation modes without creative effort.

DETAILED DESCRIPTION

Figure 1:
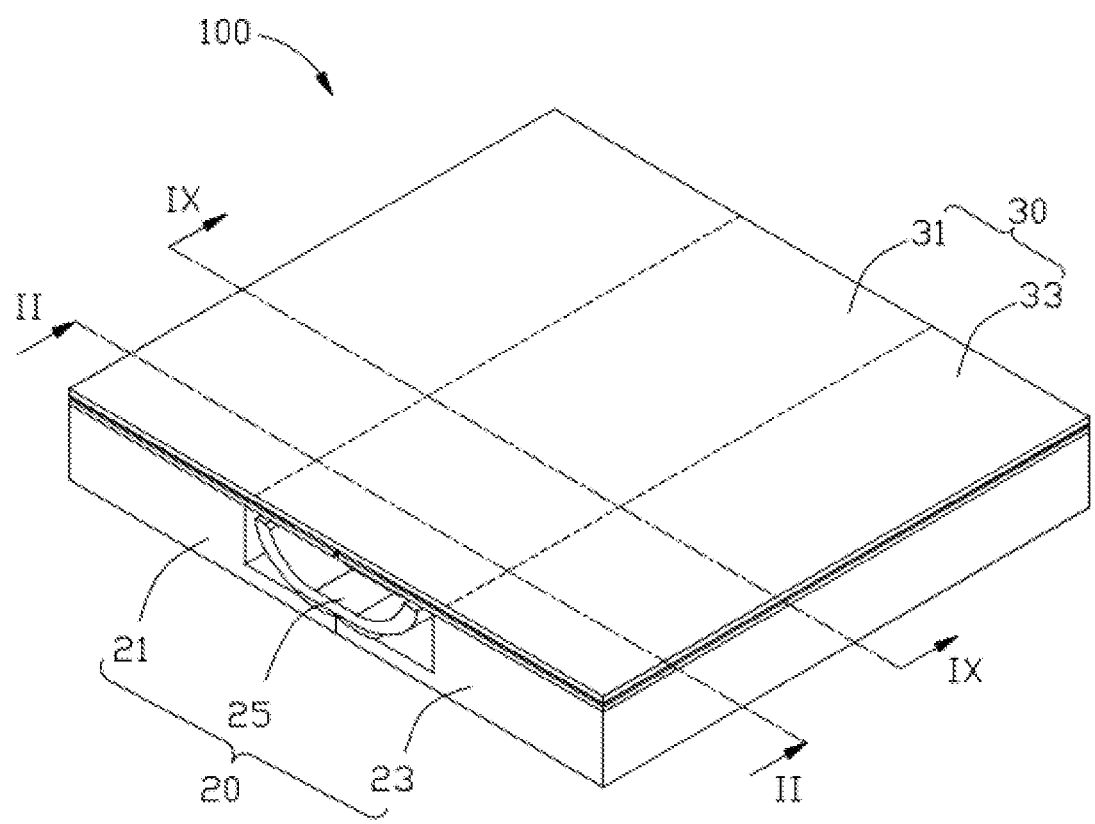
FIG. 1 is a schematic view of a stereoscopic structure of an electronic device according to implementations of the present disclosure.

A flexible display device includes a flexible screen and a rotating mechanism. The flexible screen has a bendable area and includes a screen body layer. The rotating mechanism supports the back of the bendable area, the rotating mechanism is configured to rotate around two rotating center axes spaced apart in parallel. The bendable area is configured to bend with rotation of the rotating mechanism. The screen body layer in the bendable area is a neutral layer of the flexible screen.

As an implementation, both the two rotating center axes are axis lines. The two rotating center axes are located at the neutral layer.

As an implementation, the rotating mechanism includes two rotating assemblies, the two rotating assemblies each includes a supporting frame and a rotating frame rotatably connected with the supporting frame, and for each of the two rotating assemblies, a rotating center axis around which the rotating frame rotates relative to the supporting frame is located at the neutral layer.

As an implementation, two rotating center axes around which two rotating frames rotate relative to two corresponding supporting frames of the two rotating assemblies are the two rotating center axes of the rotating mechanism.

As an implementation, the rotating mechanism further includes a gear assembly located between the two rotating assemblies, and the two rotating frames are each provided with a driving gear engaged with the gear assembly. One of the two rotating frames is configured to rotate to drive the driving gear of the rotating frame to rotate to drive the gear assembly engaged with the driving gear to rotate, so as to rotate the driving gear of the other rotating frame to drive the other rotating frame to rotate synchronously.

As an implementation, the gear assembly includes a pair of first transmission gears spaced apart in parallel and a pair of second transmission gears located between the pair of first transmission gears. The pair of first transmission gears are each engaged with the driving gear of the rotating frame of one of the two rotating assemblies, the pair of second transmission gears are engaged with each other, and the pair of second transmission gears are each engaged with one first transmission gear in the pair of first transmission gears.

As an implementation, the supporting frame defines four axle holes at one end face facing the gear assembly. The pair of first transmission gears are each sleeved with a first rotating axis, the pair of second transmission gears are each sleeved with a second rotating axis, and the first rotating axis and the second rotating axis each has two opposite ends which are rotatably connected in the corresponding axle holes.

As an implementation, the two rotating frames each includes a rotating member rotatably connected with the supporting frame and a connecting member connected with the rotating member, the connecting member includes a connecting plate extending along a direction of the rotating center axis, and the driving gear is disposed at one end of the connecting plate away from the rotating member.

As an implementation, the connecting member is clamped, screwed or glued with the rotating member; or the connecting member is integrally formed with the rotating member.

As an implementation, the driving gear is a sector gear which is disposed on one side of the connecting plate facing the rotating member.

As an implementation, the supporting frame defines an accommodation space. The rotating member is provided with a rotating block which protrudes from the rotating member and is rotatably received in the accommodation space. A rotating axis center line around which the rotating block rotates relative to the accommodation space and the rotating center axis around which the rotating frame rotates relative to the supporting frame are collinear.

As an implementation, the accommodation space is provided with a locating rod, the locating rod has two opposite ends which are respectively connected with two opposite inner walls of the accommodation space, and the locating rod is configured to stop the rotating member.

As an implementation, the housing is provided with two connecting blocks at two opposite ends of the housing and protruding into the housing, each of two supporting frames of the two rotating assemblies defines a connecting opening, and the two connecting blocks are received in and connected with the two connecting openings.

As an implementation, when the bendable area of the flexible screen is bent, the bendable area has a cross section of U-shape or water drop-shape.

An electronic device includes a first frame body, a second frame, and a flexible display device. The flexible display device includes a flexible screen and a rotating mechanism. The flexible screen has a bendable area and includes a screen body layer. The rotating mechanism is connected between the first frame body and the second frame body. The flexible screen covers the first frame body and the second frame body. The rotating mechanism supports the back of the bendable area. The rotating mechanism is configured to rotate around two rotating center axes spaced apart in parallel. The bendable area is configured to bend with rotation of the rotating mechanism. The screen body layer in the bendable area is a neutral layer of the flexible screen.

As an implementation, both the two rotating center axes are axis lines and the two rotating center axes are located at the neutral layer.

As an implementation, the rotating mechanism includes two rotating assemblies, the two rotating assemblies each includes a supporting frame and a rotating frame rotatably connected with the supporting frame, and for each of the two rotating assemblies, a rotating center axis around which the rotating frame rotates relative to the supporting frame is located at the neutral layer.

As an implementation, two rotating center axes around which two rotating frames rotate relative to two corresponding supporting frames of the two rotating assemblies are the two rotating center axes of the rotating mechanism.

As an implementation, the rotating mechanism further includes a gear assembly located between the two rotating assemblies, and the two rotating frames are each provided with a driving gear engaged with the gear assembly, one of the two rotating frames is configured to rotate to drive the driving gear of the rotating frame to rotate to drive the gear assembly engaged with the driving gear to rotate, so as to rotate the driving gear of the other rotating frame to drive the other rotating frame to rotate synchronously.

As an implementation, the flexible screen further includes a supporting membrane attached to the back of the screen body layer, a cover plate which covers the front of the screen body layer, and two supporting plates stacked between the supporting membrane and the rotating mechanism. When the first frame body and the second frame body are unfolded, the front faces of the two supporting plates are on the same plane.

The following will give a clear and complete description to a technical solution of implementations in the disclosure, with reference to accompanying drawings of implementations in the disclosure. Apparently, the implementations described hereinafter are only a part of implementations in the disclosure, and not all of them. Based on implementations in the disclosure, all other implementations obtained by those of ordinary skill in the art without creative effort fall within protection scope of the disclosure.

Figure 2:
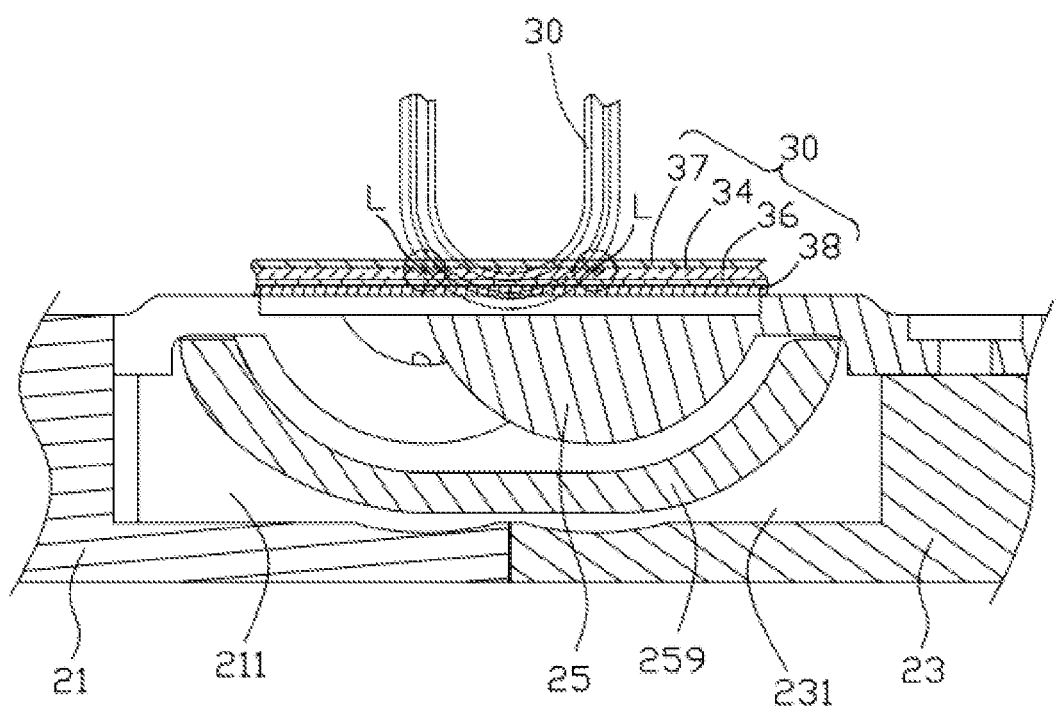
FIG. 2 is a cross-sectional view of the electronic device along line II-II in FIG. 1.

FIG. 1 is a schematic view of a stereoscopic structure of an electronic device according to implementations of the present disclosure. FIG. 2 is a cross-sectional view of the electronic device along line II-II in FIG. 1. Reference can be made to FIG. 1 and FIG. 2, an electronic device 100 according to implementations of the disclosure includes a housing 20 and a flexible screen 30 disposed on the front of the housing 20. The housing 20 includes a first frame body 21, a second frame body 23, and a rotating mechanism 25 connected between the first frame body 21 and the second frame body 23. The flexible screen 30 are disposed on the first frame body 21, the second frame body 23, and the rotating mechanism 25. The flexible screen 30 has a bendable area 31 corresponding to the rotating mechanism 25, and two non-bendable areas 33 respectively attached to two opposite sides of the bendable area 31. The backs of the two non-bendable areas 33 are respectively attached to the fronts of the first frame body 21 and the second frame body 23. The rotating mechanism 25 supports the back of the bendable area 31 of the flexible screen 30. The rotating mechanism 25 is provided with two rotating center axes L spaced apart in parallel, and the rotating mechanism 25 makes the first frame body 21 and the second frame body 23 bent or unfolded through the two rotating center axes L, such that the flexible screen 30 is bent or unfolded with the first frame body 21 and the second frame body 23. A screen body layer 34 of the flexible screen 30 is a neutral layer of the flexible screen 30 during bending of the flexible screen 30. The screen body layer 34 is a main body, which is configured to display images, of the flexible screen 30.

As an implementation, both the two rotating center axes L are virtual axes, and the two rotating center axes L are spaced apart and both located at the neutral layer.

The neutral layer means that during the bending of the flexible screen 30, an outer layer of the flexible screen 30 is stretched and an inner layer of the flexible screen 30 is squeezed. There exists a transition layer located on a cross section of the flexible screen 30, and the transition layer is neither stretched nor squeezed, therefore, the transition layer is less stressed and called the neutral layer. The screen body layer 34 in the disclosure is the neutral layer, so as to improve bending resistance of the screen body layer 34.

In this implementation, the electronic device 100 is a mobile phone. It should be understood that in other implementations, the electronic device 100 may be, but is not limited to a radio phone, a pager, a Web browser, a notepad, a calendar, and/or a personal digital assistance (PDA) with a global positioning system (GPS) receiver.

The rotating mechanism 25 of the electronic device 100 in the disclosure is provided with the two rotating center axes L spaced apart. The electronic device 100 is bent or unfolded around the two rotating center axes L. The flexible screen 30 can be bent or unfolded with the rotating mechanism 25. The screen body layer 34 of the flexible screen 30 is the neutral layer. When the electronic device 100 is bent through the rotating mechanism 25, the bendable area 31 of the flexible screen 30 is bent. Because the screen body layer 34 is the neutral layer, the screen body layer 34 is less stressed, thus the bending resistance of the screen body layer 34 can be improved, damage to the flexible screen 30 can be avoided, and the service life of the flexible screen 30 can be prolonged.

As an implementation, when the bendable area 31 of the flexible screen 30 is bent, the bendable area 31 has a cross section of U-shape.

In other implementations, when the bendable area 31 of the flexible screen 30 is bent, the bendable area 31 can have a cross section of water drop-shape, so as to reduce thickness of the electronic device 100 after being bent.

As illustrated in FIG. 2, the flexible screen 30 further includes a supporting membrane 36 attached to the back of the screen body layer 34, a cover plate 37 which covers the front of the screen body layer 34, and two supporting plates 38 stacked between the supporting membrane 36 and the rotating mechanism 25. The flexible screen 30 is stacked on the two supporting plates 38. The supporting membrane 36 is attached to the back of the screen body layer 34 through an optical adhesive, an ultraviolet rays (UV) adhesive, a backing adhesive, or other adhesives. The supporting membrane 36 may be a polyethylene terephthalate (PET) membrane, a polyimide (PI) membrane, a parylene c (PC) membrane, or the like. A supporting plate 38 is stacked between the supporting membrane 36 and the first frame body 21, so as to firmly connect the flexible screen 30 and the first frame body 21. Another supporting plate 38 is stacked between the supporting membrane 36 and the second frame body 23, so as to firmly connect the flexible screen 30 and the second frame body 23. The two supporting plates 38 may be flexible supporting sheets, and the two supporting plates 38 may be thin metal sheets such as cooper foils, liquid metal sheets, memory alloy sheets, plastic sheets, or other thin sheets made from composite materials. In this implementation, the two supporting plates 38 are thin steel sheets.

The cover plate 37 is a light-transmitting and bending-resistant sheet. In this implementation, the cover plate 37 is an ultra-thin glass cover sheet, and the thickness of the ultra-thin glass cover sheet is in a micrometer level. The ultra-thin glass cover sheet has advantages such as better bending resistance, high strength, high hardness, and the like. When the ultra-thin glass cover sheet is attached to the front of the screen body layer 34, the ultra-thin glass cover sheet can not only be bent or unfolded with the flexible screen 30, but also can effectively prevent external objects from scratching the ultra-thin glass cover sheet, which is not easy to wear. In addition, the ultra-thin glass cover sheet has a less elastic modulus and can be directly pasted on the front of the flexible screen 30. When the flexible screen 30 is bent, the ultra-thin glass cover sheet can be stretched with the flexible screen 30 synchronously or nearly synchronously, so as to avoid a situation that the flexible screen 30 is broken due to a large difference in stretching amplitude when it is bent. Furthermore, the ultra-thin glass cover sheet has a great light transmission rate, which facilitates ejection of light from the flexible screen 30. The ultra-thin glass cover sheet will not have discoloration and other aging problems after long time use.

In other implementations, the cover plate 37 can also be a flexible and transparent cover plate.

The front refers to a face facing a light-emitting face of the flexible screen 30 in the disclosure. The back refers to a face facing away from (i.e., opposite to) the light-emitting face of the flexible screen 30 (i.e., the front and back are defined relative to the light-emitting direction of the flexible screen 30).

Reference can be made to FIG. 3 to FIG. 7, the rotating mechanism 25 includes two rotating assemblies 250, a gear assembly 256 positioned between the two rotating assemblies 250, and a housing 259 for mounting the two rotating assemblies 250 and the gear assembly 256. The two rotating assemblies 250 each includes a supporting frame 251 and a rotating frame 253 rotatably connected with the supporting frame 251, for each of the two rotating assemblies 250, a rotating center axis around which the rotating frame 253 rotates relative to the supporting frame 251 is a virtual axis and is located at the neutral layer of the flexible screen 30, so as to improve the bending resistance of the flexible screen 30, and to reduce damage of the flexible screen 30 to the least. Two rotating frames 253 are each provided with a driving gear 2570 engaged with the gear assembly 256. One of the two rotating frames 253 is configured to rotate relative to a corresponding supporting frame 251 to drive a corresponding driving gear 2570 of the rotating frame 253 to rotate to drive the gear assembly 256 engaged with the driving gear to rotate, so as to achieve synchronous rotation of the two rotating frames 253 of the two rotating assemblies 250.

Figure 3:
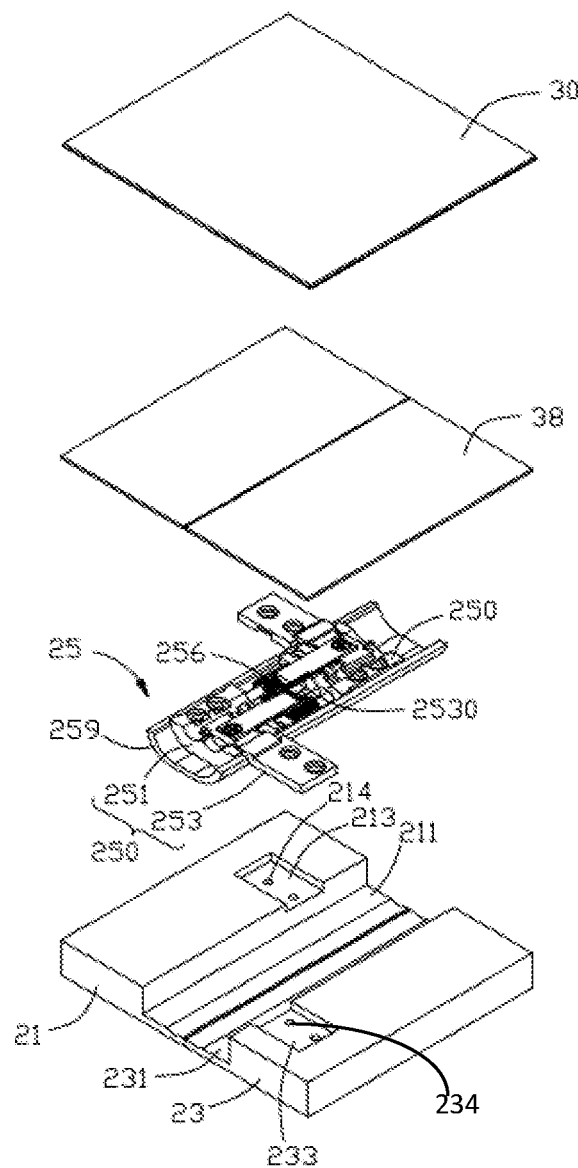
FIG. 3 is an exploded schematic view of the stereoscopic structure of the electronic device in FIG. 1.
Figure 4:
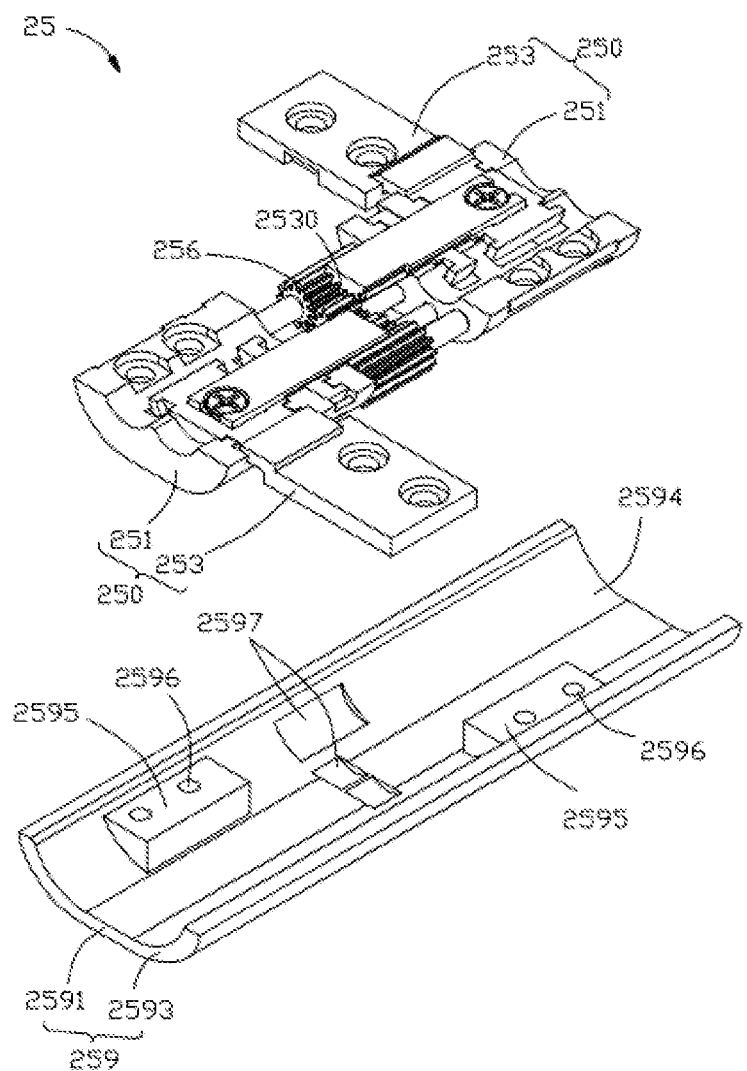
FIG. 4 is an exploded schematic view of a rotating body and a housing of a rotating mechanism in FIG. 2.

As illustrated in FIG. 3, the first frame body 21 is provided with a first accommodation groove 211 on a side adjacent to the second frame body 23, and the second frame body 23 is provided with a second accommodation groove 231 on a side adjacent to the first frame body 21. When the first frame body 21 and the second frame body 23 are unfolded, the rotating mechanism 25 is received in a space enclosed via the first accommodation groove 211 and the second accommodation groove 231. The front of the first frame body 21 defines, at a position adjacent to the first accommodation groove 211, a first mounting groove 213. The first mounting groove 213 is configured to mount an end of one of the two rotating frames 253 which is away from the corresponding supporting frame 251. The bottom of the first mounting groove 213 defines multiple locking holes 214. The front of the second frame body 23 defines, at a position adjacent to the second accommodation groove 231, a second mounting groove 233. The second mounting groove 233 is configured to mount an end of the other one of the two rotating frames 253 which is away from the corresponding supporting frame 251. Specifically, the bottom of the second mounting groove 233 defines multiple locking holes 234. As illustrated in FIG. 4, the housing 259 includes a rectangular substrate 2591 and two arc-shaped side plates 2593 located on opposite sides of the substrate 2591. The substrate 2591 and two side plates 2593 together enclose a mounting space 2594, in which the rotating assembly 250 and the gear assembly 256 are received. Two opposite ends of inner faces of the two plates 2593 are respectively provided with two connecting blocks 2595 which protrude into the mounting space 2594. The two connecting blocks 2595 each defines a connecting hole 2596. The housing 259 between the two connecting blocks 2595 defines multiple avoidance grooves 2597 on an inner face of the housing 259, and the multiple avoidance grooves 2597 are configured to avoid the gear assembly 256.

Figure 5:
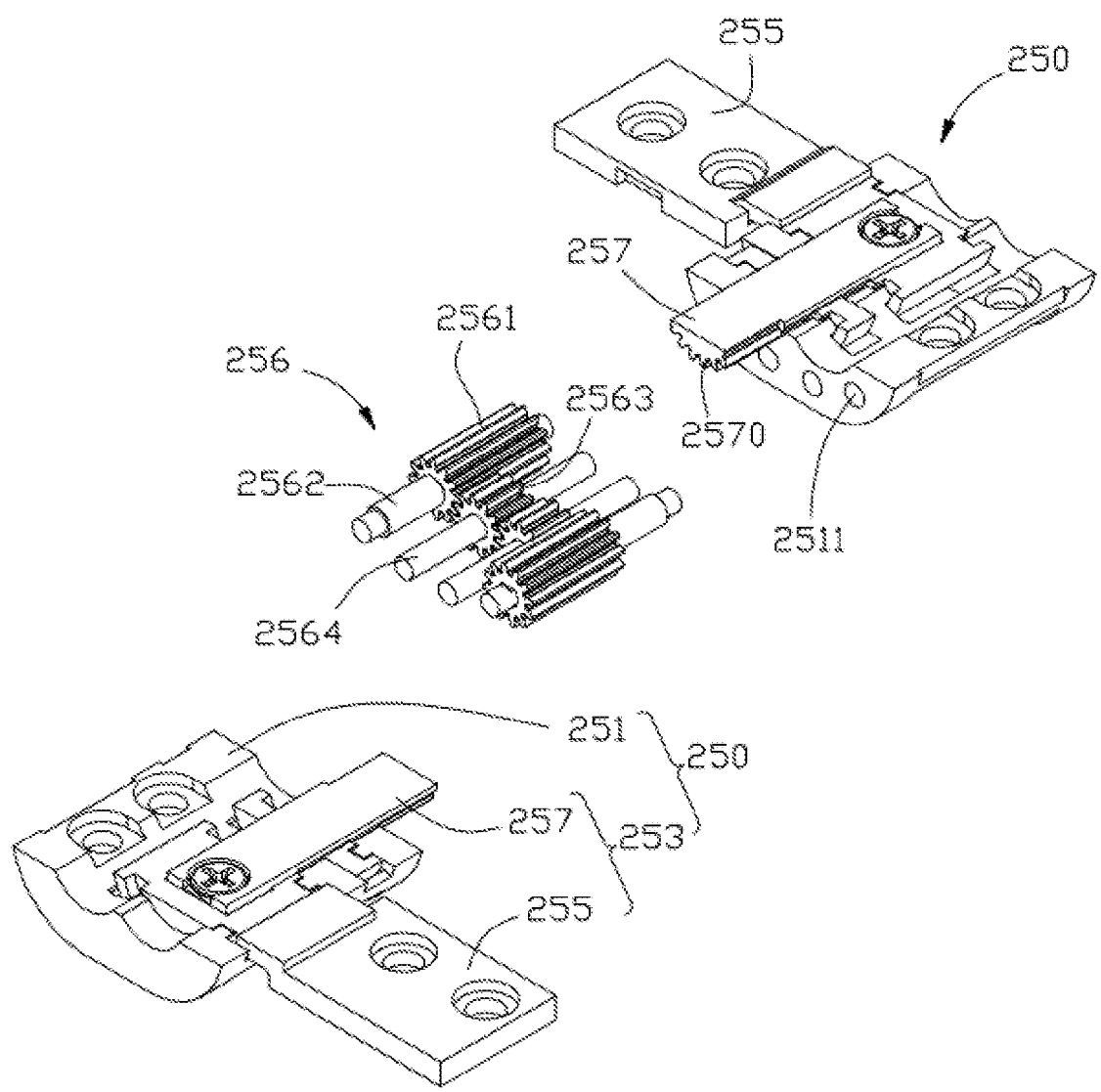
FIG. 5 is an exploded schematic stereoscopic view of the rotating body, which includes a pair of rotating assemblies and a gear assembly, of the rotating mechanism in FIG. 4.
Figure 6:
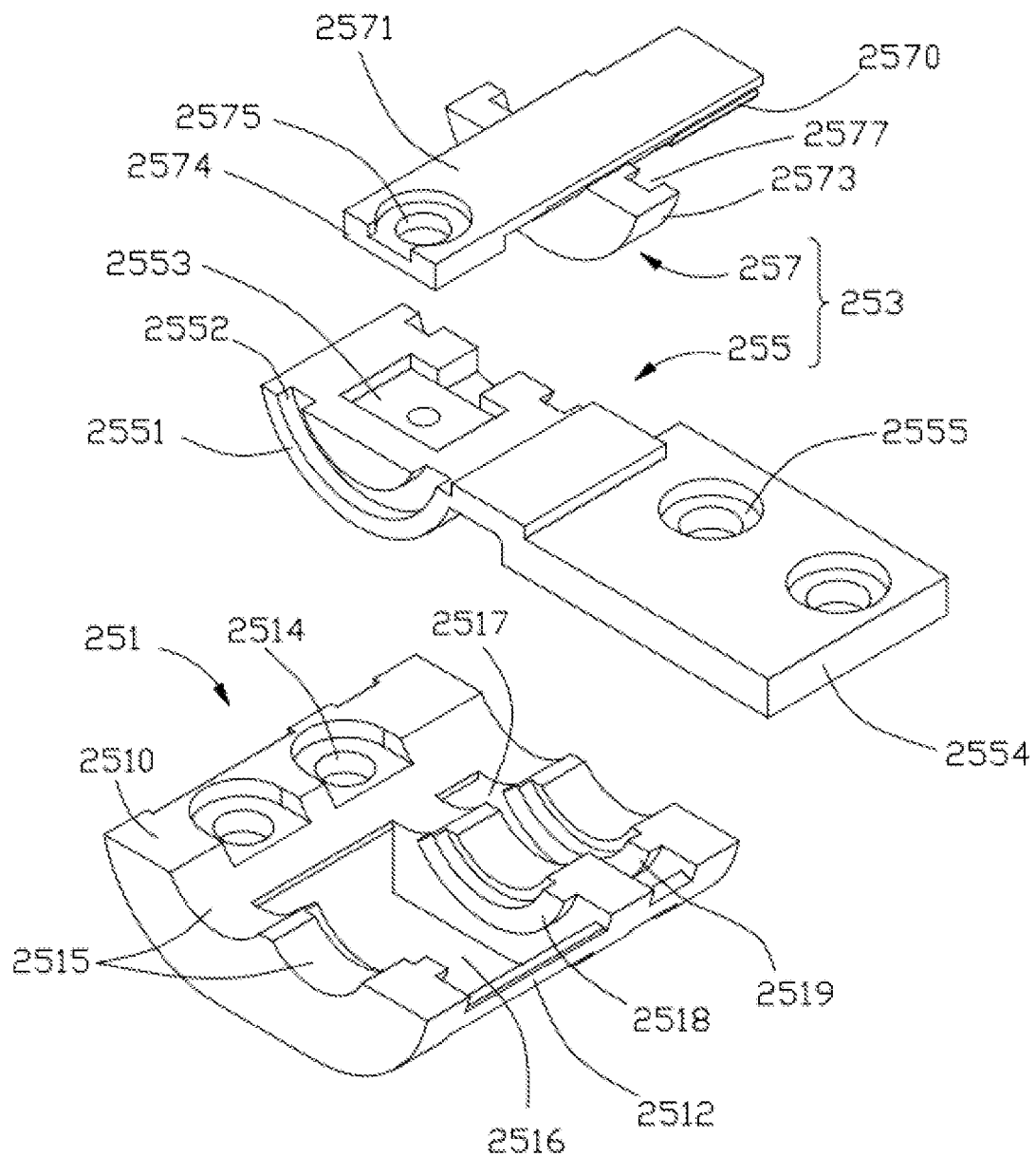
FIG. 6 is an exploded schematic stereoscopic view of one rotating assembly in FIG. 5.
Figure 7:
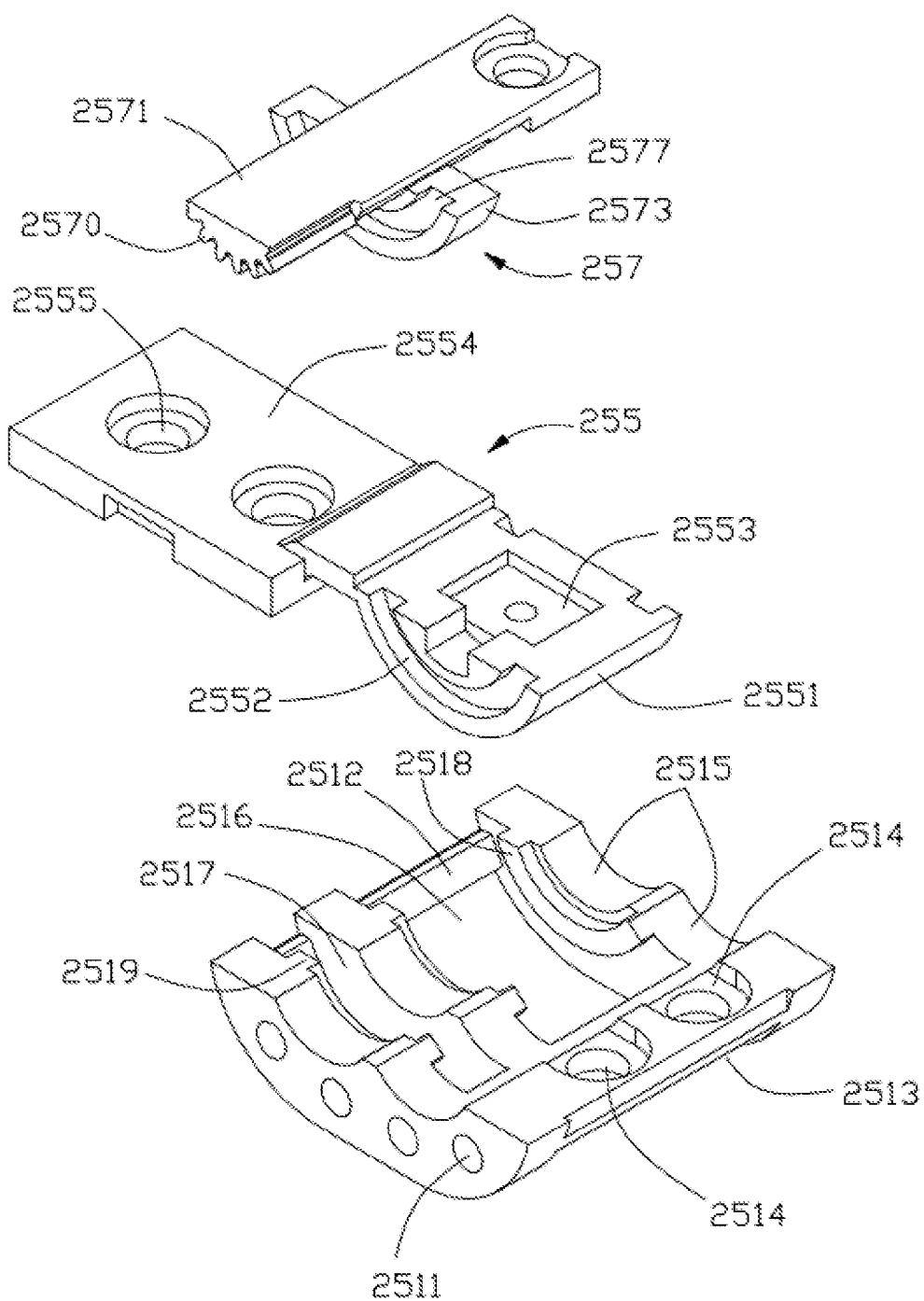
FIG. 7 is an exploded schematic stereoscopic view of the other rotating assembly in FIG. 5.
Figure 8:
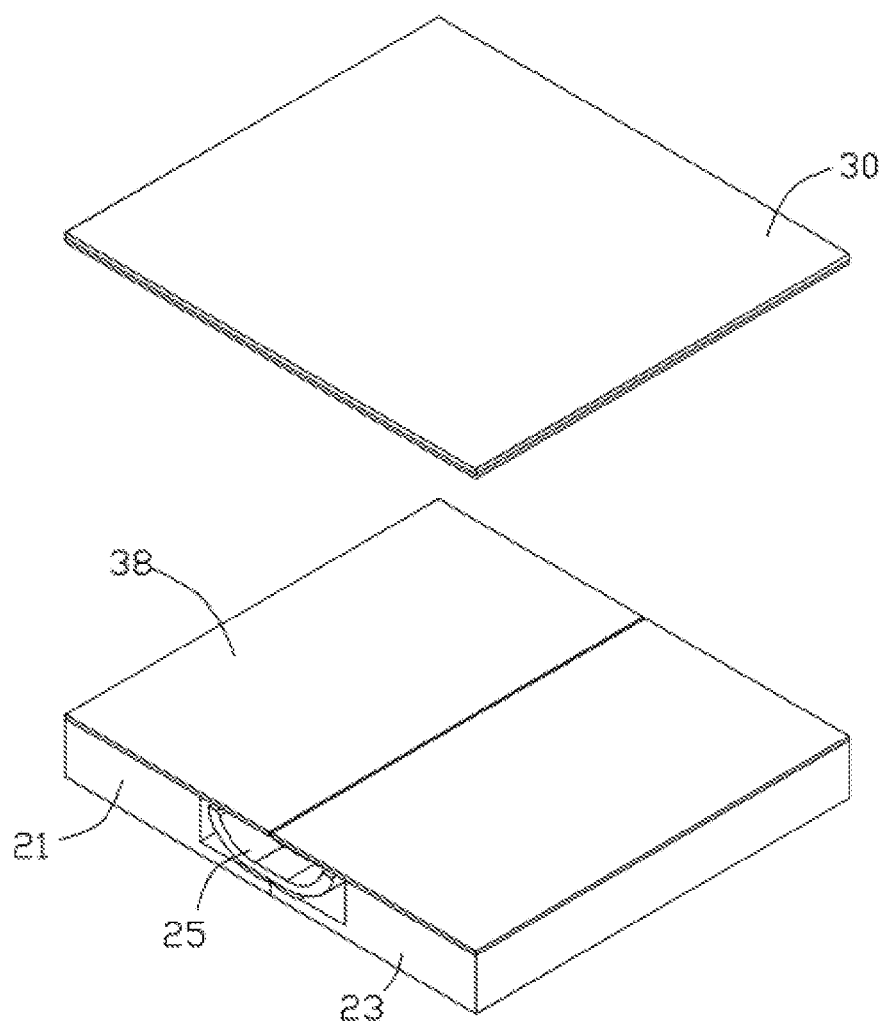
FIG. 8 is a partial schematic assembled view of the electronic device in FIG. 2.
Figure 9:
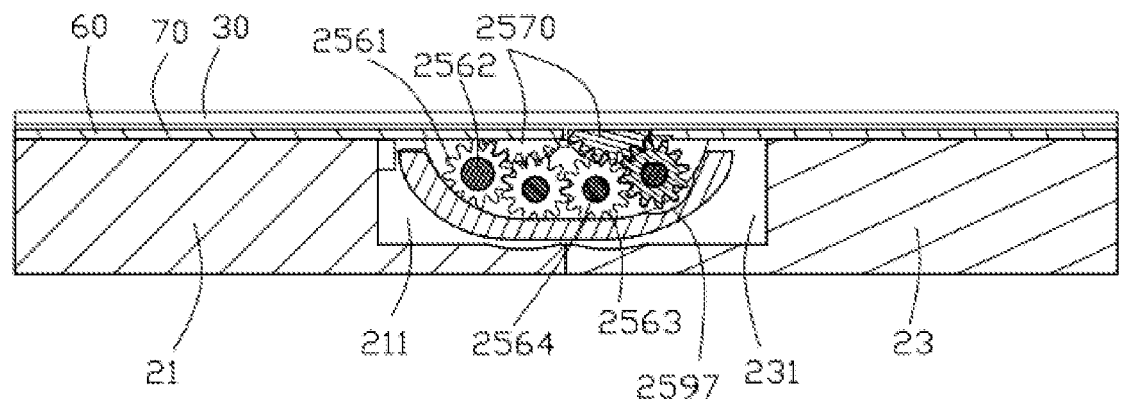
FIG. 9 is a cross-sectional view of the electronic device along line IX-IX in FIG. 1.

Reference can be made to FIG. 5 to FIG. 7, the supporting frame 251 includes a front 2510 and a back, and the back can be attached to the inner face of the housing 259. The supporting frame 251 defines multiple axle holes 2511 at one end face, and the multiple axle holes 2511 are configured to be connected with the gear assembly 256. In this implementation, the supporting frame 251 defines four axle holes which are spaced apart on an end face facing the gear assembly 256. The back defines two connecting openings 2513 corresponding to the two connecting blocks 2595. The two connecting blocks 2595 can be received and connected in the two connecting opening 2513. The front of supporting frame 251 defines two through holes 2514 corresponding to the two connecting holes 2596, and the two through holes 2514 are countersunk holes configured to receive heads of two locking members. The front 2510 defines two accommodation grooves 2515 spaced apart in parallel along an axial direction of the rotating center axis of the flexible screen 30 on a central part of the front 2510. The two accommodation grooves 2515 each has a cross section of arc-shape. The front 2510 defines an accommodation space 2516 and a guide groove 2517 on opposite ends of a side of the front 2510 away from the two through holes 2514. The accommodation space 2516 is away from the multiple axle holes 2511, the guide groove 2517 is adjacent to the multiple axle holes 2511, and both the accommodation space 2516 and the guide groove 2517 penetrate through (i.e., extend through) the two accommodation grooves 2515 and the back of the supporting frame 251. A locating rod 2512 is positioned at a side of the accommodation space 2516 away from the two through holes 2514. Two opposite ends of the locating rod 2512 are respectively connected with two opposite inner walls of the accommodation space 2516, and the locating rod 2512 is separated from the front 2510 by a distance. The supporting frame 251 is provided with a pair of arc-shaped first rotating ribs 2518 which protrude inwardly into the accommodation space 2516 on the two opposite inner walls of the accommodation space 2516. An axis center line of the pair of first rotating ribs 2518 and an axis center line of the rotating center axis of the rotating assembly 250 are collinear. The supporting frame 251 is provided with a second rotating rib 2519 which protrudes into an inner wall of the guide groove 2517. An axis center line of the second rotating rib 2519 and the axis center line of the rotating center axis of the rotating assembly 250 are collinear.

The rotating frame 253 includes a rotating member 255 and a connecting member 257. The connecting member 257 is clamped, screwed, or glued with the rotating member 255, or the connecting member 257 is integrally formed with the rotating member 255. The rotating member 255 is in a shape of a bar. A rotating block 2551 protrudes from an end of the rotating member 255, the rotating block 2551 has a cross section of arc-shape, and the rotating block 2551 can be rotatably received in the accommodation space 2516 of the supporting frame 251. The rotating block 2551 defines a pair of first arc-shaped grooves 2552 on two opposite sides of the rotating block 2551, and the pair of first arc-shaped grooves 2552 correspond to the pair of first rotating ribs 2518 in the accommodation space 2516 of the supporting frame 251. An axis center line of the pair of first arc-shaped grooves 2552 and the axis center line of the rotating center axis of the rotating assembly 250 are collinear. The rotating member 255 defines a connecting groove 2553 on the front of the rotating member 255 corresponding to the rotating block 2551, and the connecting groove 2553 defines a connecting hole on the bottom of the connecting groove 2553. The rotating member 255 is provided with a mounting plate 2554 on an end of the rotating member 255 away from the rotating block 2551, and the mounting plate 2554 defines two mounting holes 2555 on the front of the mounting plate 2554, and the two mounting holes 2555 are countersunk through holes. The rotating member 255 defines a locating groove between the rotating block 2551 and the mounting plate 2554 and on the back of the rotating member 255. The rotating member 255 is provided with a reinforcing plate corresponding to the locating groove on the front of the rotating member 255, and the reinforcing plate can enhance strength of the rotating member 255.

The connecting member 257 includes a strip-shaped connecting plate 2571 and a guide plate 2573 protruding from the back of the connecting plate 2571. The driving gear 2570 is disposed on the back of an end of the connecting plate 2571. In this implementation, the driving gear 2570 is a fan-shaped gear which is disposed on a side of the connecting plate 2571 facing the rotating member 255. Specifically, teeth of the driving gear 2570 are arranged in an arc-shape along an axial circumference on the back of the connecting plate 2571. A connecting block 2574 protrudes from an end of the back of the connecting plate 2571 away from the driving gear 2570, and the connecting block 2574 defines a countersunk hole 2575 on the front of the connecting block 2574. The guide plate 2573 is located between the driving gear 2570 and the connecting block 2574. The guide plate 2573 is perpendicular to a length direction of the connecting plate 2571. The guide plate 2573 is in a shape of semicircle. The guide plate 2573 can be rotatably received in the guide groove 2517 of the supporting frame 251. The guide plate 2573 defines, on a side, a second arc-shaped groove 2577 corresponding to the second rotating rib 2519 in the guide groove 2517 of the supporting frame 251. An axis center line of the second arc-shaped groove 2577 and the axis center line of the rotating center axis of the rotating assembly 250 are collinear.

As illustrated in FIG. 5, the gear assembly 256 includes a pair of first transmission gears 2561 spaced apart in parallel and a pair of second transmission gears 2563 located between the pair of first transmission gears 2561, and the pair of first transmission gears 2561 are engaged with the driving gear 2570 of the pair of one of the rotating assemblies 250. The pair of second transmission gears 2563 are engaged with each other, and the pair of second transmission gears 2563 are each engaged with one first transmission gear 2561 in the pair of first transmission gears 2561. The pair of first transmission gears 2561 are each sleeved with a first rotating axis 2562. The pair of second transmission gears 2563 each is sleeved with a second rotating axis 2564. The first rotating axis 2562 is parallel to the second rotating axis 2564. The first rotating axis 2562 and the second rotating axis 2564 each has two opposite ends which are connected between at least one pair of rotating assemblies 250. Specifically, the first rotating axis 2562 and the second rotating axis 2564 each has two opposite ends which can be rotatably connected in the corresponding multiple axle holes 2511. In this disclosure, all of the first transmission gear 2561, the second transmission gear 2563, and the driving gear 2570 may be spur gears.

When the rotating mechanism 25 is assembled, the two rotating assemblies 250 each is mounted first. Specifically, the connecting block 2574 of the connecting member 257 is placed in the connecting groove 2553 of the rotating member 255. The locking member is provided to penetrate through the countersunk hole 2575 to be locked in the connecting hole on the bottom of the connecting groove 2553, so as to fix the connecting member 257 to the rotating member 255. A length direction of the connecting plate 2571 is perpendicular to a length direction of the rotating member 255. The rotating block 2551 of the rotating frame 253 is inserted into the accommodation space 2516 of the supporting frame 251, and the guide plate 2573 of the rotating frame 253 is inserted into the guide groove 2517 of the supporting frame 251. The driving gear 2570 on the connecting plate 2571 is received in a corresponding receiving groove 2515, and the pair of first rotating ribs 2518 are slidably received in the pair of first arc-shaped grooves 2552 of the rotating block 2551, in addition, the second rotating rib 2519 is also slidably received in the second arc-shaped groove 2577 of the guide plate 2573. As such, the rotating frame 253 can be rotatably connected with the supporting frame 251. The gear assembly 256 is mounted between the pair of rotating assemblies 250. Specifically, the gear assembly 256 is placed between the pair of rotating assemblies 250, such that a pair of first rotating axes 2562 of the pair of first transmission gears 2561 can directly face two axle holes 2511 outside of each of the rotating assemblies 250, and the two opposite ends of each of the pair of first rotating axes 2562 can be inserted respectively into the corresponding axle holes 2511. A pair of second rotating axes 2564 of the pair of second transmission gears 2563 directly face two axle holes 2511 in the middle of each of the rotating assemblies 250, such that the two opposite ends of each of the pair of second rotating axes 2564 can be inserted respectively into the corresponding axle holes 2511. As such, the pair of first transmission gears 2561 are each engaged with the driving gear 2570, the pair of second transmission gears 2563 are engaged with each other, and the pair of second transmission gears 2563 are each engaged with one first transmission gear 2561 in the pair of first transmission gears 2561. Furthermore, the pair of rotating assemblies 250 and the gear assembly 256 are placed in the housing 259. The two connecting blocks 2595 are each inserted into the two connecting openings 2513 of the pair of rotating assemblies 250. Multiple locking members are provided to penetrate respectively through the two through holes 2514 of the corresponding supporting frame 251. The multiple locking members each is locked in the corresponding connecting hole 2596. Therefore, the pair of rotating assemblies 250 are fixed in the housing 259, and a peripheral part of the first transmission gear 2561 and the second transmission gear 2563 are received in the corresponding multiple avoidance grooves 2597.

The supporting frame 251 and the rotating frame 253 of each of the pair of assembled rotating assemblies 250 achieve mutual rotation through connection of the pair of first arc-shaped grooves 2552 and the pair of first rotating ribs 2518 which mutually cooperate. The rotating frame 253 defines the pair of first arc-shaped grooves 2552. The supporting frame 251 is provided with the pair of first rotating ribs 2518. A rotating axis around which the rotating frame 253 rotates relative to the supporting frame 251 is a virtual axis, an axis center line of the rotating axis is located outside of the rotating assembly 250, and the axis center line of the virtual axis and an axis center line of the pair of first arc-shaped grooves 2552 and the second arc-shaped groove 2577 are collinear.

In other implementations, the pair of first arc-shaped grooves 2552 can be defined on the supporting frame 251 and the pair of first rotating ribs 2518 can be disposed on the rotating frame 253. Specifically, the pair of first arc-shaped grooves 2552 are defined on the inner wall of the accommodation space 2516 of the supporting frame 251, the pair of first rotating ribs 2518 protrude from the rotating block 2551, the pair of first rotating ribs can be slidably received in the pair of first arc-shaped groove, such that the rotating frame 253 can be rotatably connected with the supporting frame 251.

In other implementations, the second arc-shaped groove 2577 can be defined on the supporting frame 251 and the second rotating rib 2519 can be disposed on the rotating frame 253. Specifically, the second arc-shaped groove 2577 is defined on the inner wall of the guide groove 2517 of the supporting frame 251, the second rotating rib 2519 protrudes from a side of the guide plate 2573, such that the second rotating rib can be slidably received in the second arc-shaped groove 2577.

In other implementations, the connecting member 257 can also be fixed to the rotating member 255 through clamping or gluing.

In other implementations, the connecting member 257 can be integrally formed with the rotating member 255.

Reference can be made to FIG. 3 to FIG. 9, when the electronic device 100 is assembled, the first frame body 21 is flush with the second frame body 23, such that the first accommodation groove 211 and the second accommodation groove 231 enclose a space. The rotating mechanism 25 is placed in the space, such that the two mounting plates 2554 of the pair of rotating members 250 are received respectively in the first mounting groove 213 and the second mounting groove 233, and multiple locking members penetrate respectively through the two multiple mounting holes 2555 on each of the two mounting plate 2554 to be locked in corresponding locking holes 214 or 234. As such, the first frame body 21 and the second frame body 23 are unfolded, the pair of rotating members 255 are each positioned on the corresponding locating rod 2512, that is, the locating rod 2512 is positioned in the locating groove between the rotating block 2551 and the mounting plate 2554 which are on the back of the rotating member 255. The two supporting plates 38 are attached respectively to the front of the first frame body 21 and the second frame body 23. The front faces of the two supporting plates 38 can be on the same plane, because all heads of the multiple locking members of the electronic device 100 are received in corresponding countersunk holes. The back of the flexible screen 30 is attached to the front of the supporting plate 38, as such, the electronic device 100 is assembled. An axis center line of the rotating axis around which the rotating frame 253 rotates relative to the corresponding supporting frame 251 is located at the neutral layer of the flexible screen 30.

Figure 10:
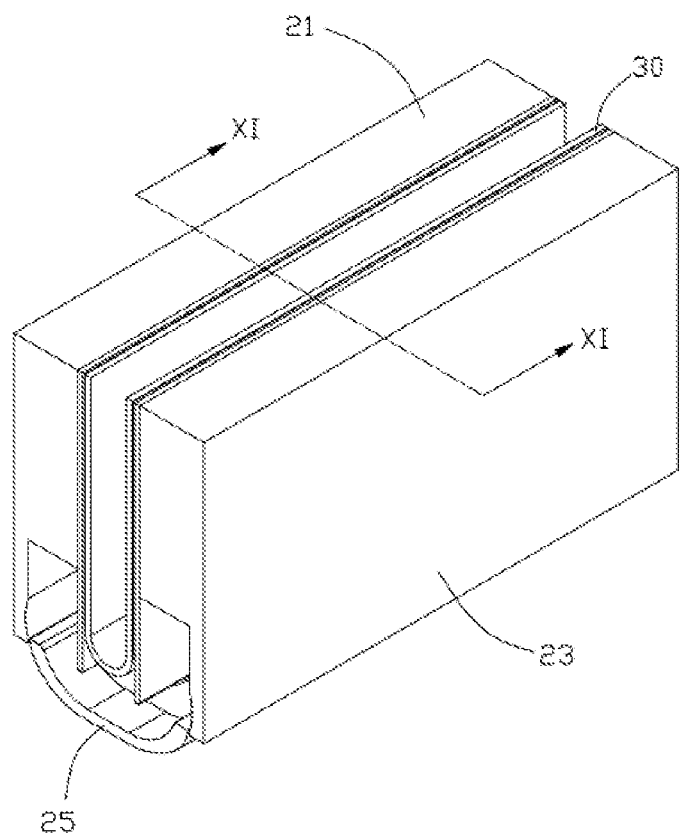
FIG. 10 is a schematic view of the electronic device in FIG. 1 in a folded state.
Figure 11:
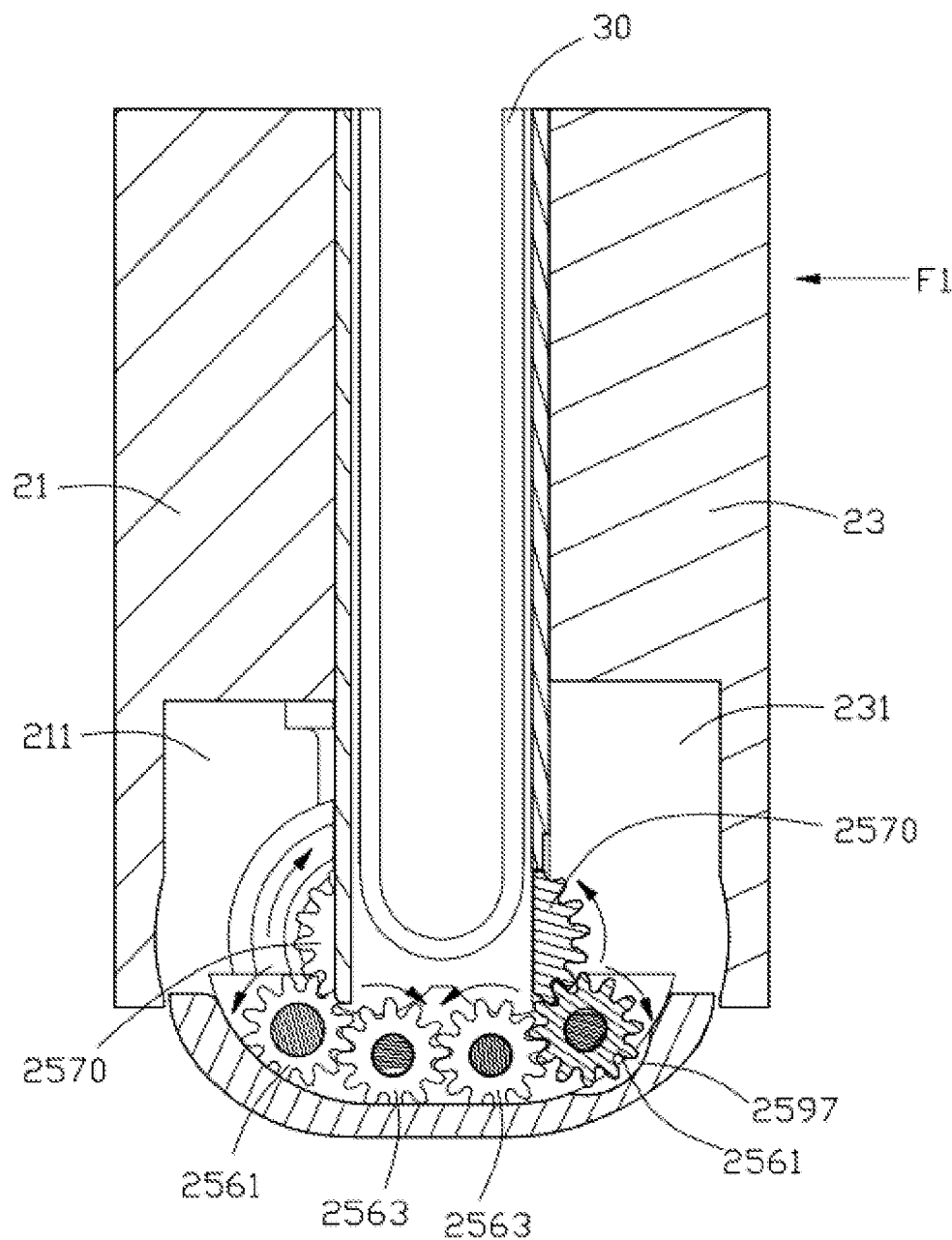
FIG. 11 is a cross-sectional view of the electronic device along line XI-XI in FIG. 10.

Reference can be made to FIG. 10 and FIG. 11, when the electronic device 100 is needed to be bent, a bending force is applied to at least one of the first frame body 21 and the second frame body 23 of the electronic device 100. As illustrated in FIG. 11, a bending force F1 is applied to the second frame body 23, such that the rotating member 255 connected with the first frame body 21 and the rotating member 255 connected with the second frame body 23 can be rotated toward each other. A rotating center axis around which each of the pair of rotating members 255 rotates relative to the corresponding supporting frame 251 is located at the neutral layer of the flexible screen 30. The screen body layer 34 of the flexible screen 30 is the neutral layer of the flexible screen 30. Specifically, the rotating member 255 fixed to the second frame body 23 rotates counterclockwise in the direction of the first frame body 21, to drive the driving gear 2570 of the rotating member 255 to rotate counterclockwise, the driving gear 2570 drives the corresponding first transmission gear 2561 to rotate clockwise, the first transmission gear 2561 drives the corresponding second transmission gear 2563 to rotate counterclockwise, the second transmission gear 2563 drives another second transmission gear 2563 to rotate clockwise, the another second transmission gear 2563 drives another first transmission gear 2561 to rotate counterclockwise, the another first drive transmission gear 2561 drives another corresponding driving gear 2570 to rotate clockwise, such that the rotating member 255 on the first frame body 21 rotates clockwise. As such, a linkage of the rotating mechanism 25 can be achieved, and the first frame body 21 and the second frame body 23 are adjacent to each other to achieve bending. The axis center line of the rotating axis around which the rotating frame 253 rotates relative to the corresponding supporting frame 251 is located at the neutral layer of the flexible screen 30, and the screen body layer 34 of the flexible screen 30 is the neutral layer, during the bending.

When the electronic device 100 is bent, the bending force may also be applied to the first frame body 21. The rotating member 255 fixed to the first frame body 21 rotates clockwise in the direction of the second frame body 23 to drive the driving gear 2570 of the rotating member 255 to rotate clockwise, the driving gear 2570 drives the corresponding first transmission gear 2561 to rotate counterclockwise, the first transmission gear 2561 drives the corresponding second transmission gear 2563 to rotate clockwise, the second transmission gear 2563 drives another second transmission gear 2563 to rotate counterclockwise, the another second transmission gear 2563 drives another first transmission gear 2561 to rotate clockwise, the another first drive transmission gear 2561 drives another corresponding driving gear 2570 to rotate counterclockwise, such that the rotating member 255 on the second frame body 23 rotates counterclockwise. As such, a linkage of the rotating mechanism 25 can be achieved, and the first frame body 21 and the second frame body 23 are adjacent to each other to achieve bending. The axis center line of the rotating axis around which the rotating frame 253 rotates relative to the corresponding supporting frame 251 is located at the neutral layer of the flexible screen 30, and the screen body layer 34 of the flexible screen 30 is the neutral layer, during the bending.

When the electronic device 100 is bent, the bending force can also be applied to the first frame body 21 and the second frame body 23 simultaneously, such that the rotating member 255 connected with the first frame body 21 and the rotating member 255 connected with the second frame body 23 can be rotated toward each other. The axis center line of the rotating axis around which the rotating frame 253 rotates relative to the corresponding supporting frame 251 is located at the neutral layer of the flexible screen 30, and the screen body layer 34 of the flexible screen 30 is the neutral layer, during the bending.

When the electronic device 100 is needed to be unfolded, an unfolding force is applied to at least one of the first frame body 21 and the second frame body 23 of the electronic device 100, such that the rotating member 255 connected with the first frame body 21 and the rotating member 255 connected with the second frame body 23 can be rotated away from each other. The rotating center axis around which each of the pair of rotating members 255 rotates relative to the corresponding supporting frame 251 is located at the neutral layer of the flexible screen 30. The screen body layer 34 of the flexible screen 30 is the neutral layer of the flexible screen 30. Specifically, the rotating member 255 fixed to the second frame body 23 rotates counterclockwise in the direction away from the first frame body 21, to drive the driving gear 2570 of the rotating member 255 to rotate clockwise, the driving gear 2570 drives the corresponding first transmission gear 2561 to rotate counterclockwise, the first transmission gear 2561 drives the corresponding second transmission gear 2563 to rotate clockwise, the second transmission gear 2563 drives the another second transmission gear 2563 to rotate counterclockwise, the another second transmission gear 2563 drives an another first transmission gear 2561 to rotate clockwise, the another first drive transmission gear 2561 drives another corresponding driving gear 2570 to rotate counterclockwise, such that a linkage of the rotating mechanism 25 can be achieved and the first frame body 21 and the second frame body 23 are away from each other to achieve unfolding.

When the electronic device 100 is unfolded, the unfolding force may also be applied to the first frame body 21. The rotating member 255 fixed to the first frame body 21 rotates counterclockwise in the direction away from the second frame body 23, to drive the driving gear 2570 of the rotating member 255 to rotate counterclockwise, the driving gear 2570 drives the corresponding first transmission gear 2561 to rotate clockwise, the first transmission gear 2561 drives the corresponding second transmission gear 2563 to rotate counterclockwise, the second transmission gear 2563 drives the another second transmission gear 2563 to rotate clockwise, the another second transmission gear 2563 drives the another first transmission gear 2561 to rotate counterclockwise, the another first drive transmission gear 2561 drives another corresponding driving gear 2570 to rotate clockwise, such that a linkage of the rotating mechanism 25 can be achieved and the first frame body 21 and the second frame body 23 are away from each other to achieve unfolding.

When the electronic device 100 is unfolded, the unfolding force can also be applied to the first frame body 21 and the second frame body 23 simultaneously, such that the rotating member 255 connected with the first frame body 21 and the rotating member 255 connected with the second frame body 23 can be rotated away from each other.

When the rotating mechanism 25 is in any one bending condition during a process from unfolding to complete bending, the rotating mechanism 25 can be positioned in the any one bending condition without external forces, because of a frictional damping force between gears of the gear assembly 256.

In the disclosure, a linkage via the spur gears engagement does not require great manufacturing accuracy, and can effectively reduce production costs and improve production efficiency, compared to a linkage via helical gears engagement.

In some implementations, both the guide groove 2517 and the second rotating rib 2519 of the supporting frame 251 in the pair of rotating assemblies 250 each can be omitted. Both the corresponding guide plate 2573 and the second arc-shaped groove 2577 on the connecting member 257 can also be omitted.

The above is the implementation in this disclosure. It should be noted that without departing from the principle of the implementation in this disclosure, those of ordinary skill in the art can also make a number of improvements and embellishments. These improvements and embellishments are also regarded as the scope of protection of this application.

What is claimed is:

1. A flexible display device, comprising:
   a flexible screen having a bendable area and comprising a screen body layer; and
   a rotating mechanism supporting the back of the bendable area, wherein the rotating mechanism is configured to rotate around two rotating center axes spaced apart in parallel, the bendable area is configured to bend with rotation of the rotating mechanism, and the screen body layer in the bendable area is a neutral layer of the flexible screen;
   wherein the rotating mechanism comprises two rotating assemblies, the two rotating assemblies each comprises a supporting frame and a rotating frame rotatably connected with the supporting frame, and for each of the two rotating assemblies, a rotating center axis around which the rotating frame rotates relative to the supporting frame is located at the neutral layer;
   the rotating mechanism further comprises a gear assembly located between the two rotating assemblies, and the two rotating frames are each provided with a driving gear engaged with the gear assembly;
   wherein the two rotating frames each comprises a rotating member rotatably connected with the supporting frame and a connecting member connected with the rotating member, the connecting member comprises a connecting plate extending along a direction of the rotating center axis, and the driving gear is disposed at one end of the connecting plate away from the rotating member.

2. The flexible display device of claim 1, wherein both the two rotating center axes are axis lines, and the two rotating center axes are located at the neutral layer.

3. The flexible display device of claim 1, wherein two rotating center axes around which two rotating frames rotate relative to two corresponding supporting frames of the two rotating assemblies are the two rotating center axes of the rotating mechanism.

4. The flexible display device of claim 3, wherein one of the two rotating frames is configured to rotate to drive the driving gear of the rotating frame to rotate to drive the gear assembly engaged with the driving gear to rotate, so as to rotate the driving gear of the other rotating frame to drive the other rotating frame to rotate synchronously.

5. The flexible display device of claim 4, wherein the gear assembly comprises a pair of first transmission gears spaced apart in parallel and a pair of second transmission gears located between the pair of first transmission gears, the pair of first transmission gears are each engaged with the driving gear of the rotating frame of one of the two rotating assemblies, the pair of second transmission gears are engaged with each other, and the pair of second transmission gears are each engaged with one first transmission gear in the pair of first transmission gears.

6. The flexible display device of claim 5, wherein the supporting frame defines four axle holes at one end face facing the gear assembly, the pair of first transmission gears are each sleeved with a first rotating axis, the pair of second transmission gears are each sleeved with a second rotating axis, and the first rotating axis and the second rotating axis each has two opposite ends which are rotatably connected in corresponding axle holes.

7. The flexible display device of claim 4, wherein the connecting member is clamped, screwed or glued with the rotating member; or the connecting member is integrally formed with the rotating member.

8. The flexible display device of claim 4, wherein the driving gear is a sector gear which is disposed on one side of the connecting plate facing the rotating member.

9. The flexible display device of claim 1, wherein the supporting frame defines an accommodation space, a rotating member is provided with a rotating block which protrudes from the rotating member and is rotatably received in the accommodation space, and a rotating axis center line around which the rotating block rotates relative to the accommodation space are the rotating center axis around which the rotating frame rotates relative to the supporting frame.

10. The flexible display device of claim 9, wherein the accommodation space is provided with a locating rod, the locating rod has two opposite ends which are respectively connected with two opposite inner walls of the accommodation space, and the locating rod is configured to stop the rotating member.

11. The flexible display device of claim 1, wherein the rotating mechanism further comprises a housing, the housing is provided with two connecting blocks at two opposite ends of the housing and protruding into the housing, each of two supporting frames of the two rotating assemblies defines a connecting opening, and the two connecting blocks are received in and connected with the two connecting openings.

12. The flexible display device of claim 1, wherein when the bendable area of the flexible screen is bent, the bendable area has a cross section of U-shape or water drop-shape.

13. An electronic device, comprising:
   a first frame body;
   a second frame body; and
   a flexible display device of claim 1,
   wherein the rotating mechanism is connected between the first frame body and the second frame body.

14. The electronic device of claim 13, wherein both the two rotating center axes are axis lines, and the two rotating center axes are located at the neutral layer.

15. The electronic device of claim 13, wherein two rotating center axes around which two rotating frames rotate relative to two corresponding supporting frames of the two rotating assemblies are the two rotating center axes of the rotating mechanism.

16. The electronic device of claim 13, one of the two rotating frames is configured to rotate to drive the driving gear of the rotating frame to rotate to drive the gear assembly engaged with the driving gear to rotate, so as to rotate the driving gear of the other rotating frame to drive the other rotating frame to rotate synchronously.

17. The electronic device of claim 13, wherein the flexible screen further comprises a supporting membrane attached to the back of the screen body layer, a cover plate which covers the front of the screen body layer, and two supporting plates stacked between the supporting membrane and the rotating mechanism; and when the first frame body and the second frame body are unfolded, the front faces of the two supporting plates are on the same plane.

* * * * *